United States Patent
Shibatani

(10) Patent No.: US 8,203,253 B2
(45) Date of Patent: Jun. 19, 2012

(54) PIEZOELECTRIC ACTUATOR, DRIVING DEVICE, POSITIONING DEVICE AND LASER MODULE

(75) Inventor: Kazuhiro Shibatani, Sakai (JP)

(73) Assignee: Konica Minolta Opto, Inc., Tokyo (JP)

(*) Notice: Subject to any disclaimer, the term of this patent is extended or adjusted under 35 U.S.C. 154(b) by 273 days.

(21) Appl. No.: 12/743,656

(22) PCT Filed: Nov. 19, 2008

(86) PCT No.: PCT/JP2008/071033
§ 371 (c)(1),
(2), (4) Date: May 19, 2010

(87) PCT Pub. No.: WO2009/066701
PCT Pub. Date: May 28, 2009

(65) Prior Publication Data
US 2010/0245963 A1  Sep. 30, 2010

(30) Foreign Application Priority Data
Nov. 21, 2007  (JP) ................... 2007-301319

(51) Int. Cl.
*H01L 41/083* (2006.01)
(52) U.S. Cl. .................. 310/328; 310/311
(58) Field of Classification Search ............ 310/323.01, 310/323.02, 328, 311
See application file for complete search history.

(56) References Cited

U.S. PATENT DOCUMENTS

| | | | | |
|---|---|---|---|---|
| 3,442,570 A | * | 5/1969 | Picker | 359/291 |
| 5,136,201 A | * | 8/1992 | Culp | 310/328 |
| 5,441,597 A | * | 8/1995 | Bonne et al. | 216/2 |
| 6,265,810 B1 | * | 7/2001 | Ngo | 310/328 |
| 7,026,745 B2 | * | 4/2006 | Dames | 310/328 |
| 7,567,017 B2 | * | 7/2009 | Yoon et al. | 310/328 |

(Continued)

FOREIGN PATENT DOCUMENTS

CN  101056075 A  10/2007

(Continued)

OTHER PUBLICATIONS

International Preliminary Report on Patentability in International Application No. PCT/JP2008/071033 mailed Jun. 17, 2010, 5 pages.
International Search Report in International Application No. PCT/JP2008/071033, mailed Feb. 3, 2009, 1 page.

*Primary Examiner* — Thomas Dougherty
(74) *Attorney, Agent, or Firm* — Brinks Hofer Gilson & Lione

(57) ABSTRACT

In a piezoelectric actuator (8) comprising a layered piezoelectric element (14) which consists of alternately stacked expansion and contraction layers (14a) and electrode layers (14b), a driving shaft (15) of which one end is fixed to one end of the piezoelectric element (14) in expansion and contraction direction, a movable member (15) frictionally engaging with the driving shaft (15) and a collar (17) bonded to the circumference of the piezoelectric element (14), by bonding the collar (17) to the circumference of the plurality of the expansion and contraction layers (14a) with an adhesive (G) so that fastening force of the collar (17) to the expansion and contraction layers (14a) is imbalanced with reference to the center of the cross section of the piezoelectric element (14) so that the piezoelectric element (14) expands and contracts in an imbalanced manner to incline the driving shaft (15) to displace minutely the movable member (16).

14 Claims, 15 Drawing Sheets

U.S. PATENT DOCUMENTS

| | | | |
|---|---|---|---|
| 7,775,634 B2 * | 8/2010 | Silverbrook | 347/54 |
| 7,859,169 B2 * | 12/2010 | Stocker et al. | 310/328 |
| 2002/0163282 A1 * | 11/2002 | Heinz | 310/328 |
| 2004/0000838 A1 * | 1/2004 | Toda | 310/311 |
| 2007/0236101 A1 | 10/2007 | Onozuka et al. | |
| 2008/0315725 A1 * | 12/2008 | Konstanzer et al. | 310/338 |
| 2008/0315726 A1 * | 12/2008 | Dollgast et al. | 310/348 |

FOREIGN PATENT DOCUMENTS

| | | |
|---|---|---|
| JP | 06-265759 A | 9/1994 |
| JP | 2003-338795 | 11/2003 |
| JP | 2006-081348 A | 3/2006 |
| JP | 2007-236138 A | 9/2007 |
| JP | 2007-282448 A | 10/2007 |

* cited by examiner

PIEZOELECTRIC ACTUATOR, DRIVING DEVICE, POSITIONING DEVICE AND LASER MODULE

FIELD OF THE INVENTION

Present invention relates a piezoelectric actuator, a driving device, a positioning device and a laser module.

BACKGROUND ART

In the Patent citation 1, it is described that a laser device guides a laser light emitted by a light projecting portion such as a laser oscillator into a light receiving member such as an optical fiber with aligning manner. In the Patent citation 1, the laser light is aligningly positioned with respect to the optical fiber, by a technique referred to as wobbling which includes oscillating minutely the optical member with a certain amplitude and measuring a variation of the intense of the laser light (a detection output) at the optical fiber to detect an amount of miss-alignment of the laser light and then moving the optical member into a position where the receiving light intense of the laser light will be optimized.

In the case where the optical member is driven by a frictional driving type of driving device using a piezoelectric actuator, the displacement of the optical member can vary with the direction of driving. In this case, a displacement when the optical member is moved the certain small distance forwardly and a displacement when the optical member is moved over the certain small distance backwardly are different from each other. Thereby, an error is caused in an amount of the deviation from a point of the optical member where is calculated from the variation of the laser light intense so as to maximize the laser light intense. Such error can cause problematically a requirement of a number of the wobbling operation repeated to achieve accurate positioning, or a deviation of the optical member that can not be eliminate by the wobbling operation in the case where the driving displacement is large with respect to the variance of the detection output in the wobbling operation.

Also, in the piezoelectric actuator, there is a problem that driving performance will be changed due to an abnormal wear of the driving shaft in its frictionally contacting portion through a repeat of sliding displacements in a small area.

Moreover, the piezoelectric actuator can make driving displacement for each pulse of driving voltage smaller with reducing amplitude of the driving voltage. However, driving voltages smaller than certain amplitude can not cause a sliding displacement, hence it has been a problem that the piezoelectric actuator can not obtain minute displacement.

Patent citation 1: JP 2003-338795 A
Patent citation 2: JP H6-265759 A

SUMMARY OF THE INVENTION

In the view of the above problems, a object of the present invention is to provide a piezoelectric actuator, a driving device and positioning device capable of minute driving without error and a laser module capable of accurate aligning.

In order to solve the above object, a piezoelectric actuator according to the present invention comprises a layered piezoelectric element which consists of alternately stacked expansion and contraction layers and electrode layers, a driving shaft of which one end is fixed to one end of the piezoelectric element in the expansion and contraction direction, a movable member frictionally engaging with the driving shaft, and a collar bonded to the circumference of the piezoelectric element, wherein the collar is bonded to a plurality of the expansion and contraction layers so that the fastening force of the collar to the expansion and contraction layers is imbalanced with reference to the center of the cross section perpendicular to the direction of the expansion and contraction of the piezoelectric element.

With this configuration, in expansion and contraction layers of the piezoelectric element, a portion where the applied fastening force by the collar is weaker expands and contracts widely and a portion where the applied fastening force by the collar is stronger expands and contracts narrowly. Thereby, the expansion and contraction layers bonded to the collar expand and contracts in an imbalanced manner to incline the driving shaft. Also, the driving shaft can be inclined by deformation of the collar or the adhesive due to expansion and contraction of the piezoelectric element. Such inclination of the driving shaft causes the moveable member to be swigged so as to move minutely as a cosine variance in a pulse driving direction. Since this movement does not involve slide displacement, the moving amount does not vary and the abrasion of the driving shaft is not caused.

In the actuator according to the present invention, the collar may be not bonded partially to the circumference of the expansion and contraction layers.

With this configuration, since the collar does not fasten the expansion and contraction layers at the unbonded portion, the imbalance of the fastening force applied to the expansion and contraction layers grows so as to enhance the inclination of the driving shaft due to the imbalanced deformation of the piezoelectric element, and thereby the moving amount of the movable member may be increased.

In the actuator according to the present invention, the collar may be bonded to the expansion and contraction layers with partially different adhesives having different Young's modulus.

With this configuration, simultaneously with enabling an inclination of the driving shaft by imbalance or the fastening force, since the collar and the piezoelectric element is further bonded with the adhesive having a small Young's modulus which shows a weaker fastening force applied to the expansion and contraction layers, the circumference of the piezoelectric element may be widely held with fixing the collar to a chassis or the like. Therefore, even with employing the construction in that the piezoelectric element is supported by collar, it has a reduced risk of dropping out of the piezoelectric element due to an impact from outside.

In the actuator according to the present invention, the piezoelectric element may have a circumference shaped in a rectangular form and one side of the circumference is bonded to the collar.

With this configuration, the difference of the deformation between the unbonded side and an opposing bonded side causes an inclination of the driving shaft. Therefore, the driving shaft is efficiently inclined and an individual difference is reduced.

In the actuator according to the present invention, the piezoelectric element may have a circumference shaped in a rectangular form and three side of the circumference are bonded to the collar.

With this configuration, because one side is unbonded, the fastening force of collar is imbalanced so as to allow an inclination of the driving shaft. And because three sides are bonded, the collar may support firmly the piezoelectric element.

In the actuator according to the present invention, the piezoelectric element may have a circumference shaped in a circular form and the collar is bonded half around the piezoelectric element.

With this configuration, the configuration to receive the piezoelectric element is as a cylindrical form, hence the production of the collar may be easy.

In the actuator according to the present invention, the collar may be at least partially open viewed from the center of the cross section of the piezoelectric element.

With this configuration, the adhesive hardly comes around the opened portion of the collar, hence an unbonded portion is formed to provide constantly an imbalance. Furthermore, since the piezoelectric element can be fitted in the collar through the opening, its production may be enhanced.

In the actuator according to the present invention, the collar may have a hole in which the piezoelectric element and the driving shaft are inserted.

With this configuration, the piezoelectric element and the driving shaft fit in the collar. Therefore, the piezoelectric element and the driving shaft may be easily held by the collar, thereby the variance of the orientation of the driving shaft at the assembling may be reduced.

In the actuator according to the present invention, the collar may support the jointed portion of the piezoelectric element and the driving shaft.

With this configuration, when the collar holds the piezoelectric element, the collar holds not only the piezoelectric element but also the driving shaft. Therefore, when the driving shaft is subjected to an external force so as to incline the driving shaft, the force inclining the driving shaft may be distributed not only to the bonded surface of the piezoelectric element and the driving shaft but also the bonded surface of the collar and the driving shaft, hence the piezoelectric actuator has a high impact strength.

In the actuator according to the present invention, the working point of the movable member may be offset from the driving shaft in a direction in which the fastening force of the collar is most imbalance.

With this configuration, a position of the working point of the movable member with reference to the center of the swing of the driving shaft due to the deformation of the piezoelectric element has an angle with respect to the axial direction of the driving shaft from the beginning. Therefore, a rate of cosine change with reference to the swing angle of the driving shaft is increased so as to obtain enough displacement with a minute deformation of the collar.

Further, a driving device according to the present invention comprises any one of the above piezoelectric actuators, and a driving circuit capable of applying a dynamic driving voltage and a static driving voltage to the piezoelectric element of the piezoelectric actuator, wherein the dynamic driving voltage causes the driving shaft of the piezoelectric actuator to reciprocate asymmetrically so as to displace slidingly the movable member, and the static driving voltage causes the driving shaft to move slowly so as not to displace slidingly the movable member.

With this configuration, by applying the static driving voltage to incline the driving shaft, the movable member can be displaced without slide movement.

In the driving device according to the present invention, the static driving voltage may be a cyclic voltage having lower frequency than the dynamic driving voltage.

With this configuration, the movable member can be displaced a certain minute amount back and forth by reciprocating the driving shaft with the static driving voltage. With adjusting the power of the dynamic driving voltage based on the detected value in response to the constant minute displacement of the movable member obtained with the static driving voltage, the movable member can be driven with a high degree of accuracy.

Further, a positioning device according to the present invention comprises any one of the above driving devices, a displacement detector outputting a displacement output which peaks when the movable member of the driving device is locating at a predetermined position, and comes lower with the movable member being further from the predetermined position, and a controller which determines the applying amount of the dynamic driving voltage based on a variation of the displacement output while a movement of the movable member with the static driving voltage, so as to maximize the displacement output.

With this configuration, in the case where the displacement output conforms to the Gaussian distribution, a difference of the displacement output between at a positive and a negative static driving is virtually proportional to the shift distance from the position where the displacement output shows peaks. Thereby, the position where the displacement output shows peaks can be calculated to position the movable member.

Further, a laser module according to the present invention comprises any one of the above positioning devices and a light receiving member receiving laser light and outputting the laser light, wherein the displacement detector of the positioning device is a sensor which detects the output power of the light receiving member and the movable member of the positioning device is an optical member which position the laser light with respect to the light receiving member.

With this configuration, the output power peaks when the axis of the laser light aligns with the optical center of the light receiving member. Therefore, the power can be maximized by aligning the laser light.

According to the present invention, since the circumference of the bonded portion of the piezoelectric element and the driving shaft is partially bonded to the collar, when the piezoelectric element expands or contracts statically, an amount of expansion and contraction of the collar is different between the bonded portion and the unbonded portion of the collar to the piezoelectric element so as to incline the driving shaft. Thereby, the movable member can be swung to be displaced without slide movement with respect to the driving shaft.

EXPLANATION OF REFERENCE SIGNS

Figure 1:
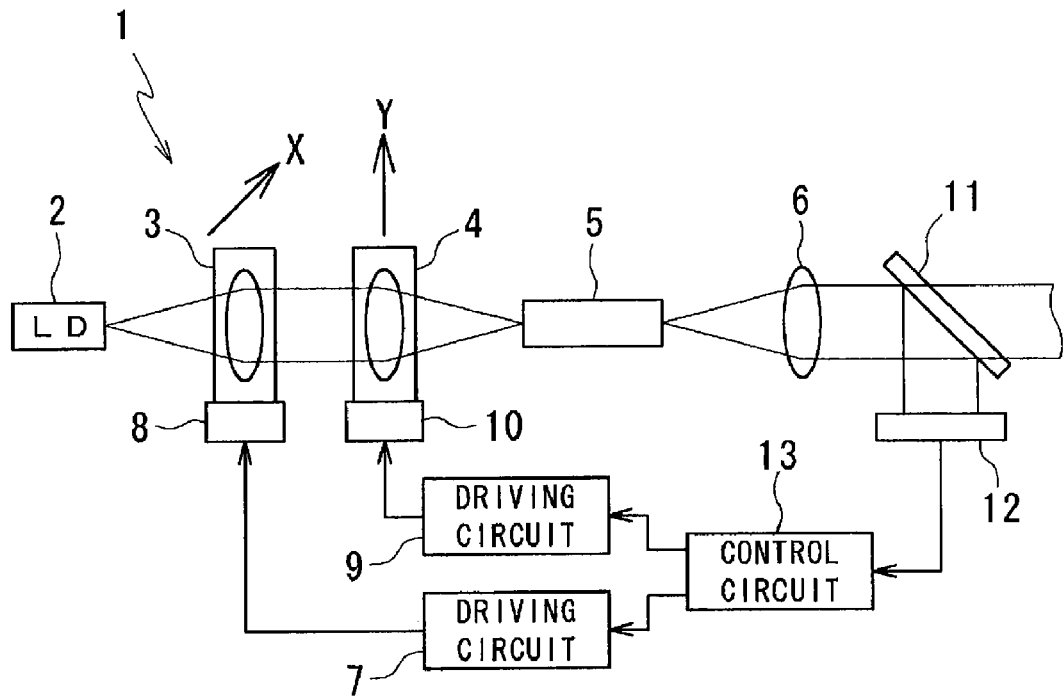
FIG. 1 is schematic configuration diagram of a laser module as first embodiment according to the present invention.

1 . . . laser module
2 . . . laser diode
3 . . . X-axis aligning lens
4 . . . Y-axis aligning lens
5 . . . second harmonic generator (light receiving member)
7 . . . X-axis driving circuit
8 . . . X-axis actuator
9 . . . Y-axis driving circuit
10 . . . Y-axis actuator
12 . . . power monitor (sensor)
13 . . . control circuit
14 . . . piezoelectric element
15 . . . driving shaft
16 . . . movable member
17 . . . collar
21 . . . controller
G . . . adhesive
P . . . optical center (working point)

BEST MODE FOR CARRYING OUT THE INVENTION

Hereinafter, embodiments according to the present invention are described with referring attached drawings. FIG. 1 shows a laser module 1 as the first embodiment according to the present invention. The laser module 1 has a laser diode 2 generating an infrared laser light, a X-axis aligning lens 3 movable in X direction and a Y-axis aligning lens 4 movable in Y direction orthogonal to the X direction both to guide the laser light, a second harmonic generator 5 which is a light receiving member receiving the laser light to generate a green laser light having half wavelength of the infrared laser light, and an emission lens 6 releasing the output of the second harmonic generator 5. The X-axis aligning lens 3 and the Y-axis aligning lens 4 are driven respectively by an X-axis actuator 8 with a driving voltage from an X-axis driving circuit 7 and by a Y-axis actuator 10 with a driving voltage from a Y-axis driving circuit 9. Further, the laser module 1 has a beam splitter 11 dividing the output light from the second harmonic generator 5, a power monitor (detector) 12 consist of a sensor such as a photodiode to transform a output power level of a divided output light of the second harmonic generator 5 into an electric voltage (displacement output), and a control circuit 13 controlling the operation of the X-axis driving circuit 7 and Y-axis driving circuit 9 based on the displacement output from the power monitor 12.

The second harmonic generator 5 has 1-3 μm of a diameter of its light receiving portion. The X-axis aligning lens 3 and the Y-axis aligning lens 4 focus the laser light in a diameter coordinated with the light receiving portion of the second harmonic generator 5 and also align the axis of the laser light with the center of the light receiving portion of the second harmonic generator 5. In the case where the axis of the laser light is aligned with the center of the light receiving portion of the second harmonic generator 5, the all energy of the laser light is input into the second harmonic generator 5, and then the output of the second harmonic generator 5 is optimized and the displacement output of the power monitor 12 is maximized.

Figure 2:
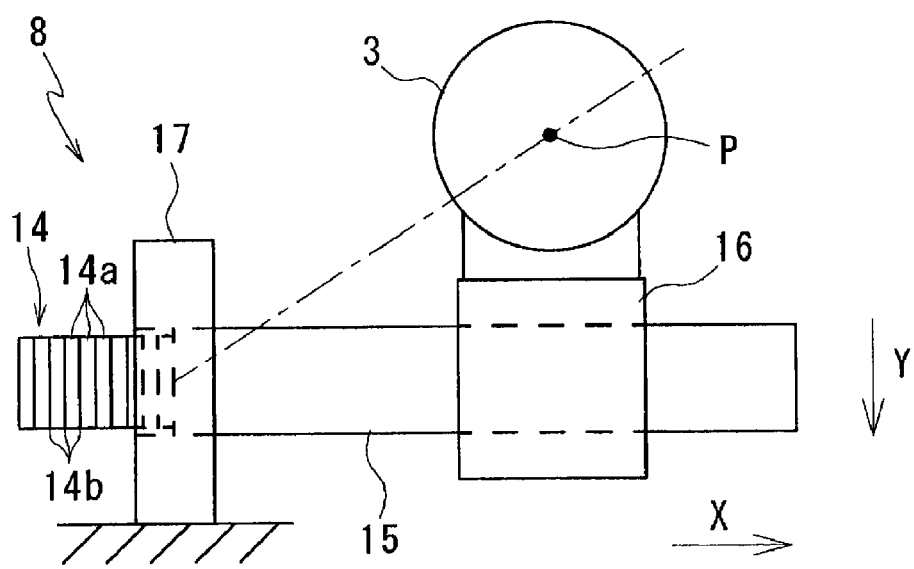
FIG. 2 is a schematic view of a piezoelectric actuator of the laser module in FIG. 1.

FIG. 2 shows a configuration of the X-axis actuator (piezoelectric actuator) 8 which moves the X-axis aligning lens 3. The X-axis actuator 8 comprises a layered type of piezoelectric element 14 which consists of alternately stacked expansion and contraction layers 14a and electrode layers 14b and which expands and contracts in the X direction according to an applied voltage, a driving shaft 15 of which one end is fixed to the piezoelectric element 14 in the expansion and contraction direction and which extends in the X direction, a movable member 16 which frictionally engages with the driving shaft 15 and holds the X-axis aligning lens 3, and a collar 17 which is bonded to the circumference of the bonded portion of the piezoelectric element 14 and the driving shaft 15 and supports the piezoelectric element 14 and the driving shaft 15. The X-axis aligning lens 3 is held at a lateral side of the movable member 16. Therefore, the optical center (working point) P as the center position of the operation of the movable member 16 is held in a sifted position from the sectional center of the piezoelectric element 14 and the driving shaft 15. Y-axis actuator 10 has a same configuration with the X-axis actuator 8 and is different from the X-axis actuator just in the disposed orientation.

Figure 3:
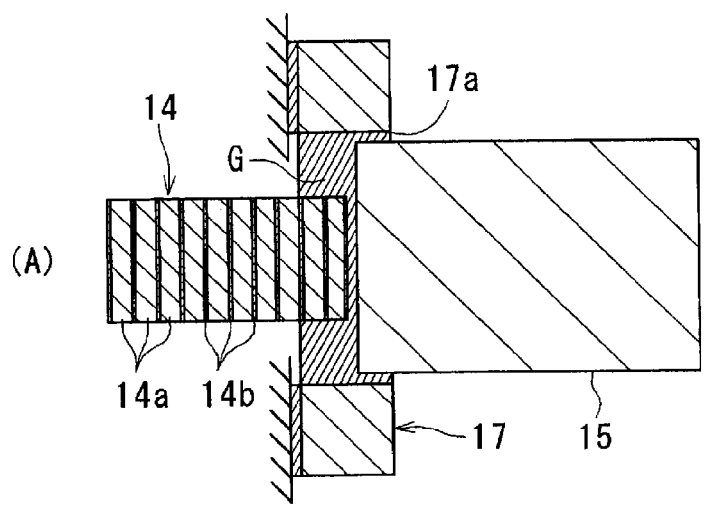
FIG. 3 is an axial sectional view of the piezoelectric actuator in FIG. 2.
Figure 3:
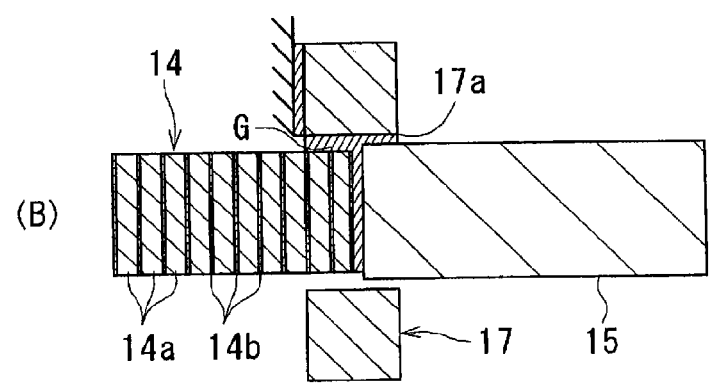
Figure 4:
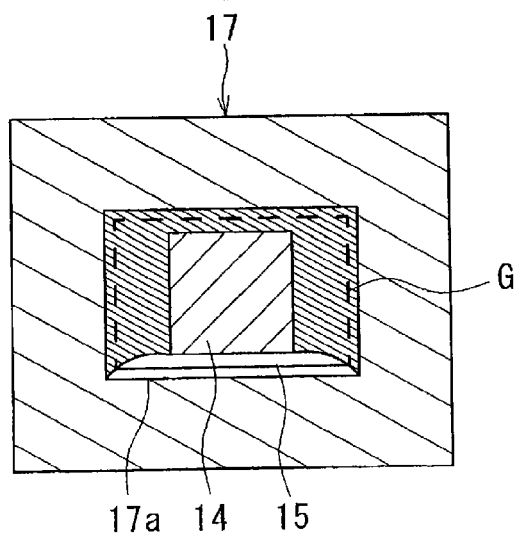
FIG. 4 is a cross sectional view of the piezoelectric actuator in FIG. 2.

FIG. 3 shows a section in the Y direction (A) and a section in Z direction orthogonal to the X direction and the Y direction (B). FIG. 4 shows the X-axis actuator 8 viewed from the side of the piezoelectric element 14 in the X direction. The piezoelectric element 14 and the driving shaft 15 have a rectangular circumferential (sectional) shape respectively, and their opposing end face are bonded with a adhesive G each other. The collar 17 has a fitting hole 17a sleeved around the piezoelectric element 14 and the driving shaft 15, and inner wall of the fitting hole 17a is bonded to the circumference of the piezoelectric element 14 and the driving shaft 15 with the adhesive G. However, the adhesive G is not applied on one side of the circumference of the piezoelectric element 14 and the driving shaft 15. Thus, three side of the circumference of the piezoelectric element 14 and the driving shaft 15 are bonded to the collar 17, but the last one side is unbonded to the collar 17.

The used adhesive G is a kind of that has a large Young's modulus and so less elastic deformability such as epoxy based adhesive. Thereby, the collar 17 holds the circumference of the piezoelectric element 14 via the adhesive G and so fastens the expansion and contraction layers 14a to restrict the dimensional displacement of the piezoelectric element 14 in the X direction. In the X-axis actuator 8, the collar 17 is bonded in an imbalanced manner to the two expansion and contraction layers 14a of the piezoelectric element 14, so that the fastening force applied to the said two expansion and contraction layers 14a is weaker (not present) in lower side and stronger in upper side on the FIG. 4. Also, the collar 17 is bonded to an immobile component such as a chassis of the device with adhesive G. The optical center (working point) of the X-axis alignment lens 3 which is not shown in FIGS. 3, 4 is positioned in the side where the adhesive is not applied and the collar 17 is unbonded, with reference to the center of the section of the piezoelectric element 14 and the driving shaft 15.

Figure 5:
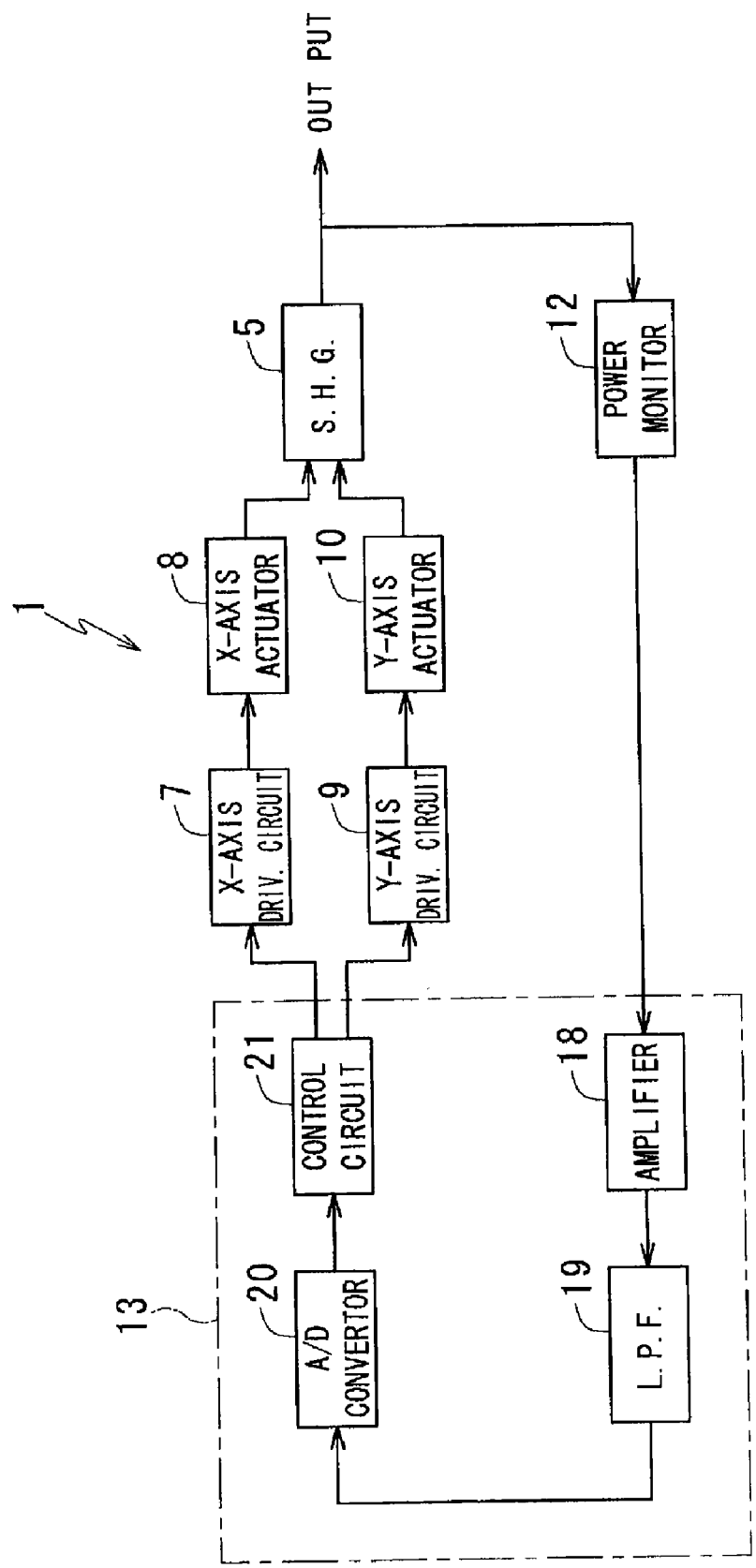
FIG. 5 is a block diagram of the laser module in FIG. 1.

FIG. 5 shows the configuration of the control circuit 13. The control circuit 13 has an amplifier 18 amplifies the displacement output from the power monitor 12, a low pass filter 19 removing noise components from the amplified displacement output, an A/D converter transforming the displacement output into digital, and a controller 21 consisting of a microprocessor controlling the operation of the X-axis driving circuit 7 and Y-axis driving circuit 9 based on the displacement output transformed in digital for moving the X-axis aligning lens 3 and the Y-axis aligning lens 4 so as to align the axis of the laser light with the second harmonic generator 5.

Figure 6:
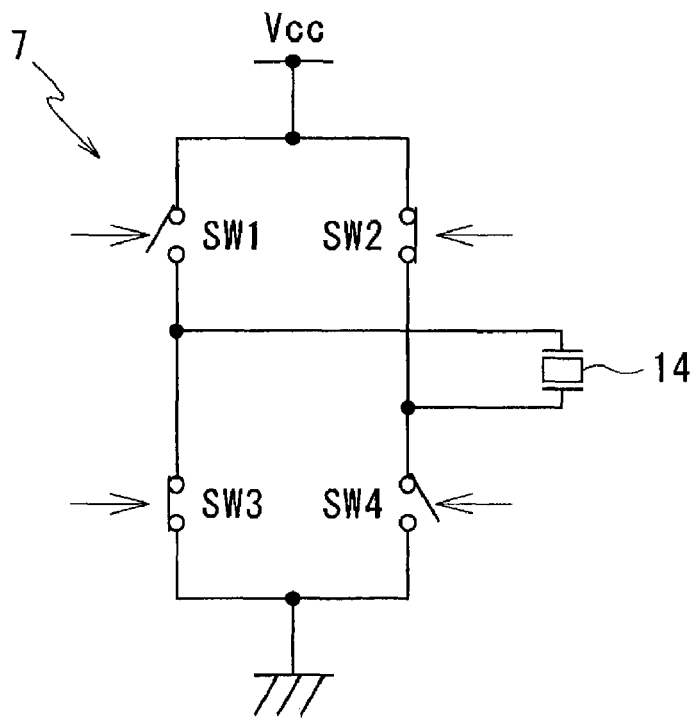
FIG. 6 is a circuit diagram of a driving circuit of the laser module in FIG. 1.

FIG. 6 shows details of the X-axis driving circuit 7. The X-axis driving circuit 7 is a bridge circuit having switches SW1, SW2 which connect the both electrodes of the piezoelectric element 14 to the power source with Vcc(V) of voltage and switches SW3, SW4 which connect the both electrodes of the piezoelectric element 14 to the ground. The four switches SW1, SW2, SW3, SW4 consist of transistors for instance and are turned on/off according to respective control signal output from the controller 21. The controller 21 can apply a +Vcc(V) of voltage to the piezoelectric element 14 by turning on the switches SW1, SW4 and turning off the switches SW2, SW3, and can apply a −Vcc(V) of voltage to the piezoelectric element 14 by turning off the switches SW1, SW4 and turning on the switches SW2, SW3. Also, the Y-axis driving circuit 9 has a same configuration as the X-axis driving circuit V.

Figure 7:
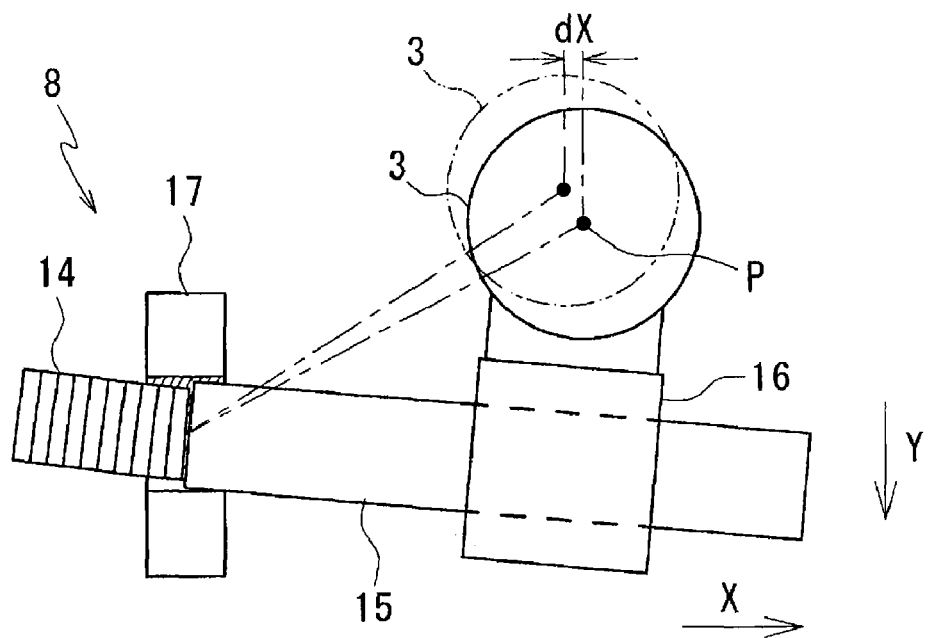
FIG. 7 is a schematic view of the piezoelectric actuator in FIG. 2 with a static driving voltage applied.

FIG. 7 shows a deformation of the X-axis actuator 8 when a +Vcc(V) of voltage is continuously applied to the piezoelectric element 14. The piezoelectric element 14 expands in X direction with a positive voltage applied. However, a fastened (bonded) portion of the expansion and contraction layer 14a by the collar 17 via the adhesive G can expand only as far as it can cause the adhesive to deform elastically. On the other hand, an unfastened portion of the same expansion and contraction layer 14a by the collar 17 freely expands widely. Therefore, the piezoelectric element 14 expands distortedly so as to inflect itself. The distorted expansion of the piezoelectric element 14 inclines the end face of the piezoelectric element 14 and therefore inclines the front end of the driving shaft 15 in a direction toward the unbonded portion (Y direction) as illustrated in the Fig. Due to this inclination of the driving shaft 15, the X-axis alignment lens 3 swings so that the optical center P of the X-axis alignment lens 3 are displaced as just variance of the cosine through its swing with reference to the bended portion of the piezoelectric element 14 and the driving shaft 15. Therefore, in the case where the optical center P of the X-axis alignment lens 3 are shifted in Y direction from the beginning, displacement in X direction by an inclination of the driving shaft 15 is increased.

Figure 8:
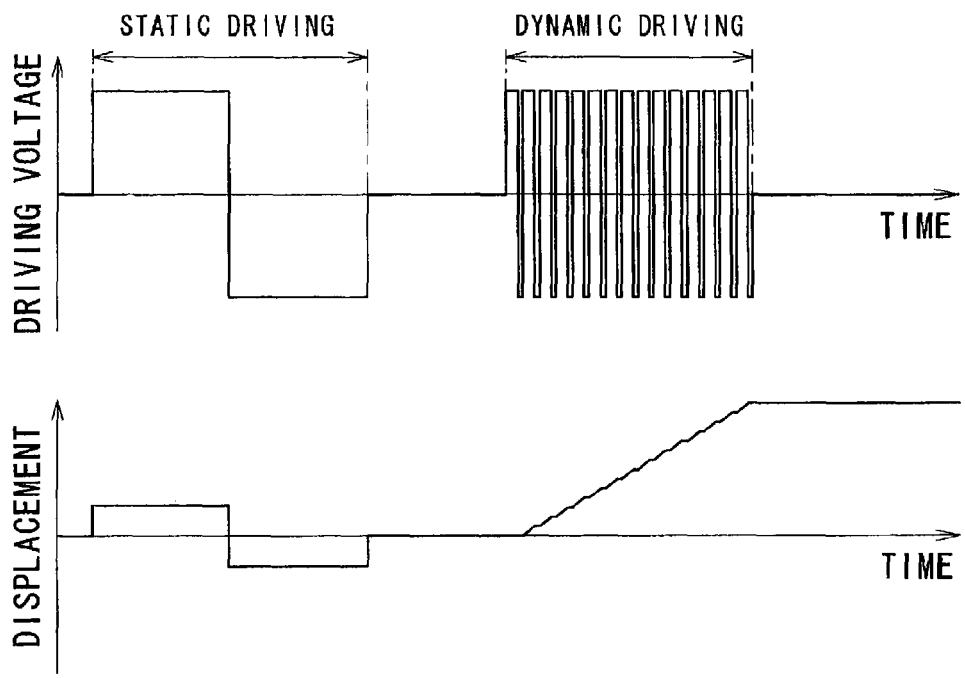
FIG. 8 is a chart showing an output waveform of the driving circuit and a displacement of the movable member in the laser module in FIG. 1.

FIG. 8 shows a waveform applied to the X-axis actuator 8 by the X-axis driving circuit 7. X-axis driving circuit 7 outputs a long period static driving voltage, for instance, with 100 Hz of frequency and 50% of duty ratio, and a short period dynamic driving voltage, for instance, with 360 kHz of frequency and 70% (or 30%) of duty ratio. In the X-axis actuator 8, when the static driving voltage having a long period is applied, the driving shaft 15 inclines in the Y direction so that the movable member 16 is minutely displaced in the X direction with keeping frictional engagement with the driving shaft 15. Alternatively, in the X-axis actuator 8, when the dynamic driving voltage having a short period is applied, in the case where the duty ratio is 70%, the driving shaft 15 moves slowly in the positive direction and rapidly in the negative direction so that the movable member 16 slidingly moves in the positive direction with respect to the driving shaft 15. In the case where the dynamic driving voltage has a the duty ratio of the 30%, the driving shaft 15 moves slowly in the negative direction and rapidly in the positive direction so that the movable member 16 slidingly moves in the negative direction with respect to the driving shaft 15.

Figure 9:
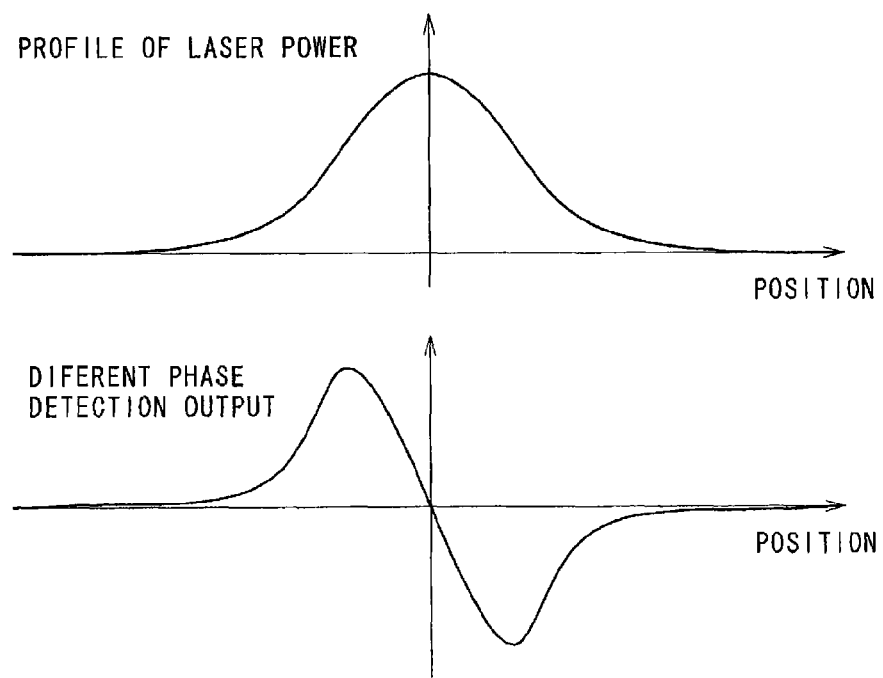
FIG. 9 is a chart showing a profile of a displacement output with respect to the displacement of the movable member in the laser module in FIG. 1.
Figure 10:
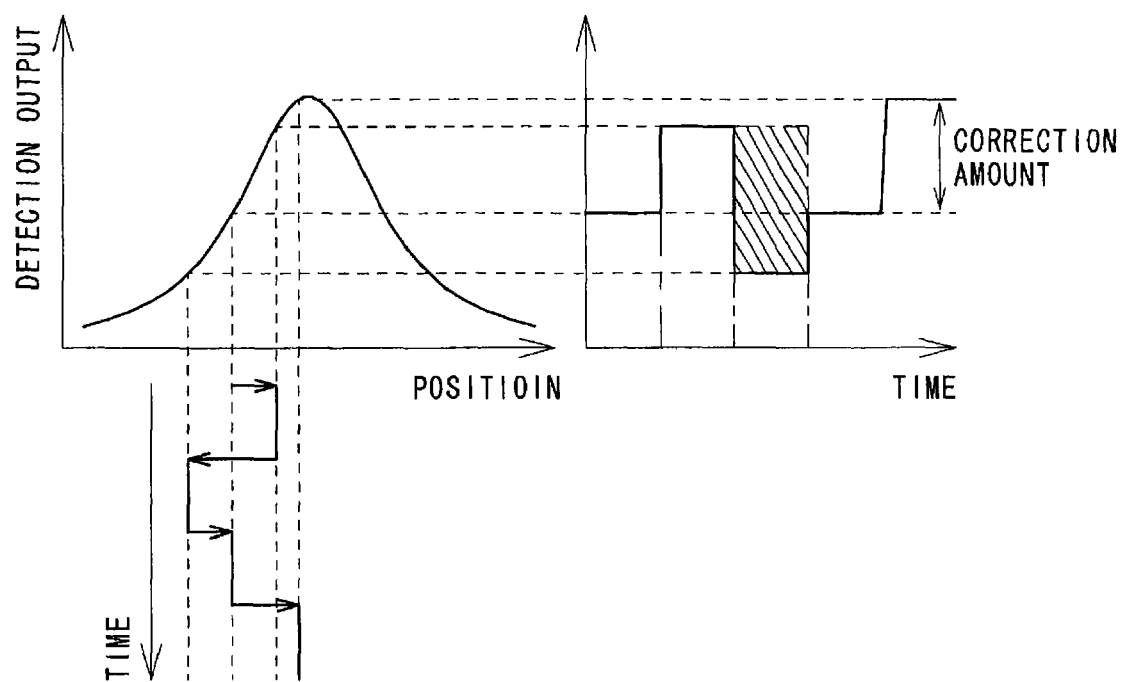
FIG. 10 shows a principle of the aligning by the wobbling in the laser module in FIG. 1.

With respect to the displacement of the X-axis aligning lens 3 held by the movable member 16, the displacement output from the power monitor 12 represent a Gaussian distribution as shown in FIG. 9. In proximity to the position where the displacement output peaks, a difference of the displacement output from the power monitor 12 between with positive and negative static driving voltage (different phase detection output) is proportional to an amount of miss-alignment of the laser light with the second harmonic generator 5. Therefore, by multiplying the deference of the displacement output from the power monitor 12 by a predetermined coefficient, a number of pulses of the dynamic driving voltage required to be applied to the X-axis actuator 8 to move the movable member 16 to the position where the displacement output is maximized can be calculate.

Here, if the dynamic driving voltage is a rectangular wave having a frequency at about 70% of the resonance frequency of the piezoelectric element 14 and the driving shaft 15 in compression manner and a duty ratio of 70% or 30%, the movable member 16 is enhanced to move slidingly with respect to the driving shaft 15. Additionally, if the static driving voltage is a rectangular wave having a frequency lower than the resonance frequency of the piezoelectric element 14 and the driving shaft 15 in bending manner and a duty ratio of 50%, the movable member 16 is minutely displaced back and forth one time each accurately by a certain amount according to the amplitude of the static driving voltage.

The resonance frequency of lateral swing of the piezoelectric element 14 and the driving shaft 15 due to bending in the Y direction is designed sufficiently lower compared to the resonance frequency in a longitudinal vibration due to compression in the X direction, for instance about $1/100$. Therefore, the frequency of the static driving voltage is sufficiently lower than the frequency of the dynamic driving voltage so that the movable member is not slidingly displaced with respect to the driving shaft.

The laser module 1 aligns the laser light with the second harmonic generator 5 also in the Y direction in a similar manner to the alignment of the laser light with the second harmonic generator 5 in the X direction as described above.

Figure 11:
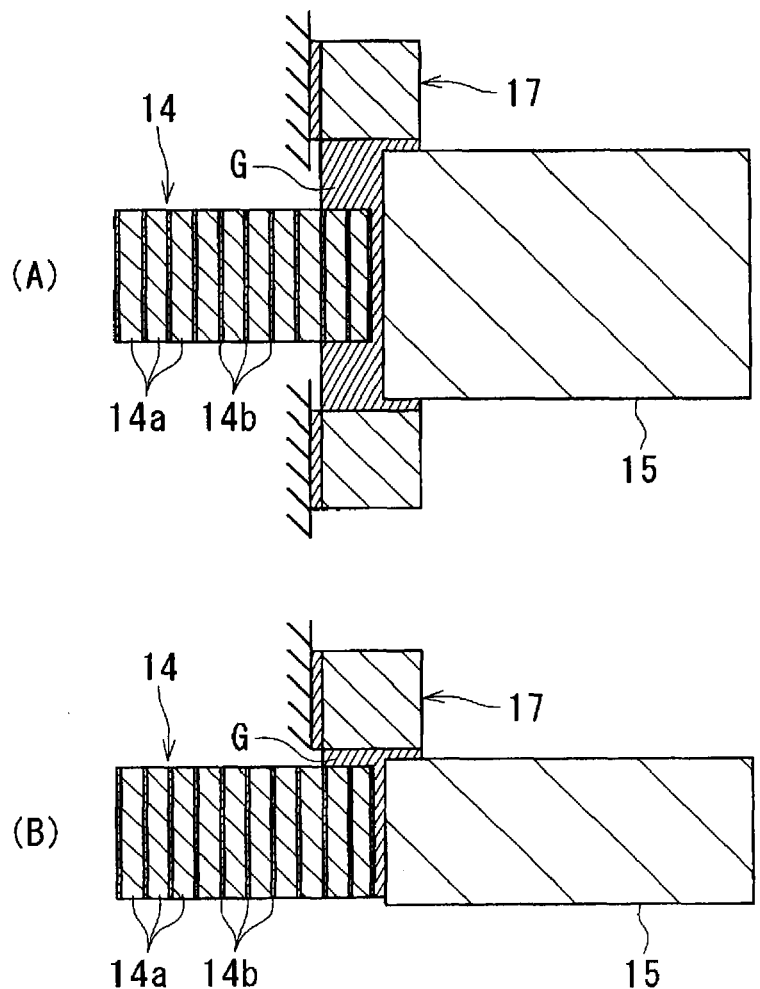
FIG. 11 is an axial sectional view of the piezoelectric actuator of the second embodiment according to the present invention.
Figure 12:
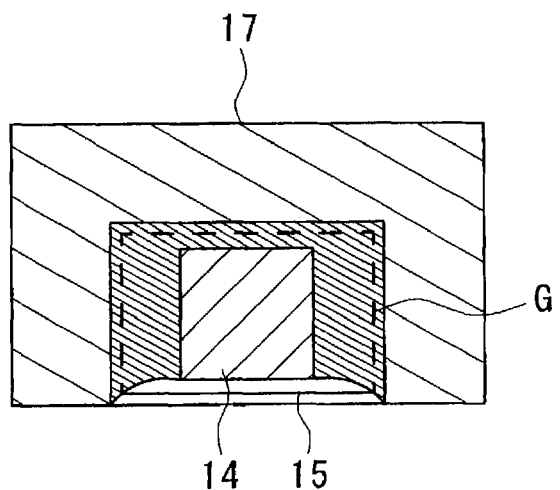
FIG. 12 is a cross sectional view of the piezoelectric actuator in FIG. 11.

Additionally, FIG. 11 and FIG. 12 show a configuration of an X-axis actuator 8 of the second embodiment according to the present invention. The laser module 1 of this embodiment has same configuration with the first embodiment, excepting the shown X-axis actuator 8 and a Y-axis actuator 10 almost configured similarly to the X-axis actuator 8. Therefore, repeating descriptions are omitted. The collar 17 of the X-axis actuator 8 of this embodiment is formed in a C shape which abuts to three sides and opens to one side of the bonded portion of the piezoelectric element 14 and the driving shaft 15.

In this embodiment, since one side of the piezoelectric element 14 and the driving shaft 15 is opened, even with using an adhesive G having high permeability, the adhesive G never comes around over the unbonded portion, hence the unbonded portion is surely maintained. Therefore, the bonded portion and the unbonded portion of the collar 17 are segmented as designed so as to incline the driving shaft 15 accurately in the Y direction by applying the static driving voltage. Moreover, the X-axis actuator 8 can be assembled by inserting the piezoelectric element 14 and the driving shaft 15 into the collar 17 through the opened portion, and therefore the X-axis actuator 8 is easily produced.

Figure 13:
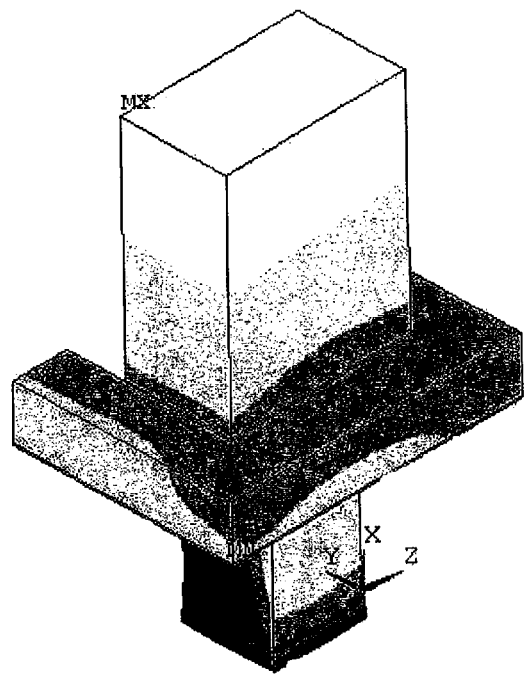
FIG. 13 is a displacement distribution map of the piezoelectric actuator in FIG. 11 with a positive static driving voltage applied.
Figure 14:
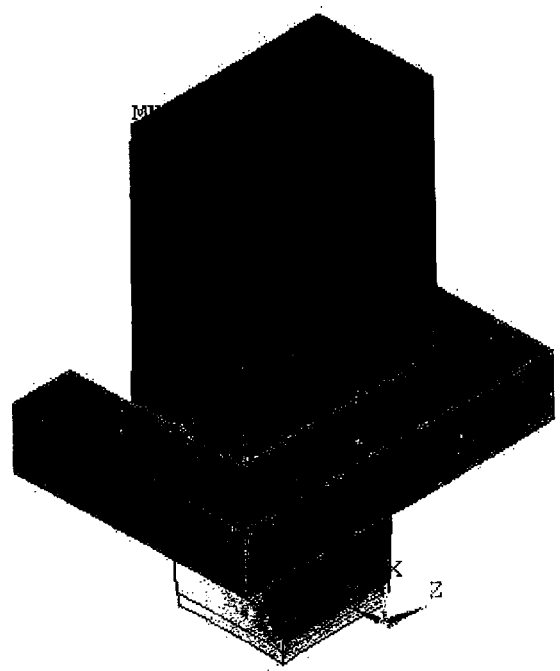
FIG. 14 is a displacement distribution map of the piezoelectric actuator in FIG. 11 with a negative static driving voltage applied.

FIG. 13 and FIG. 14 show results of simulations of displacement in the Y direction in the X-axis actuator 8 with the static driving voltage applied. FIG. 13 shows a case of applying +3V to the piezoelectric element 14, and FIG. 14 shows a case of applying −3V to the piezoelectric element 14. It is noted that the X-axis actuator 8 is oriented the front end of the driving shaft 15 up in these drawings for convenience of simulation. In the drawings, darker collared portions are displaced positively in the Y direction and lighter collared portions are displaced negatively in the Y direction. In this embodiment, the front end portion of the driving shaft 15 is displaced +5.6 nm in FIG. 13 and −5.6 nm in FIG. 14.

Figure 15:
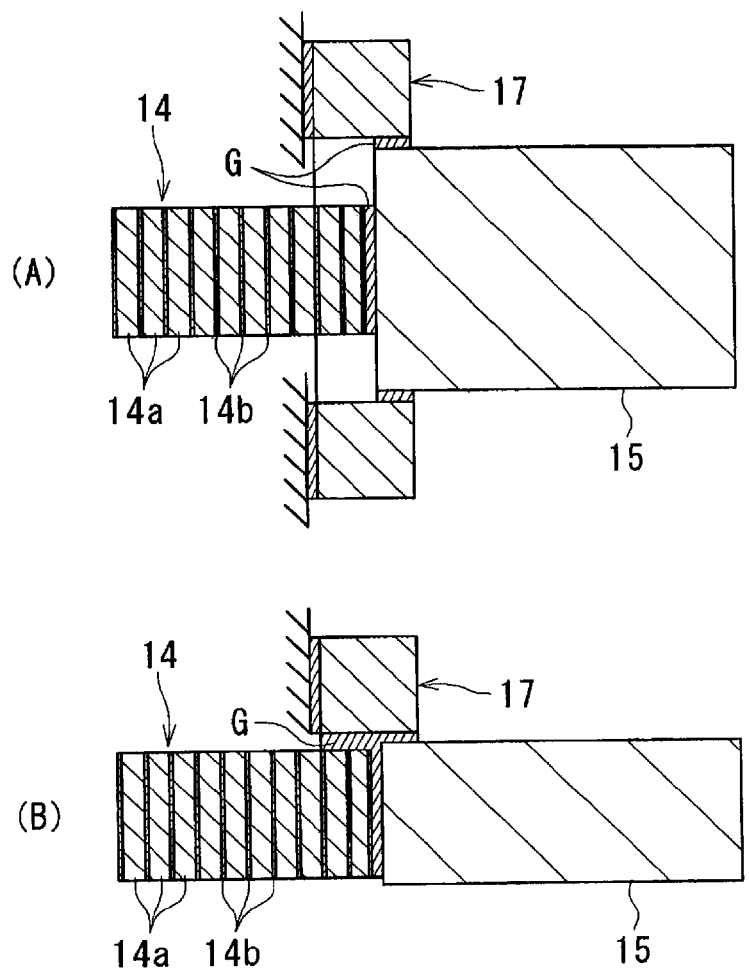
FIG. 15 is an axial sectional view of the piezoelectric actuator of the third embodiment according to the present invention.
Figure 16:
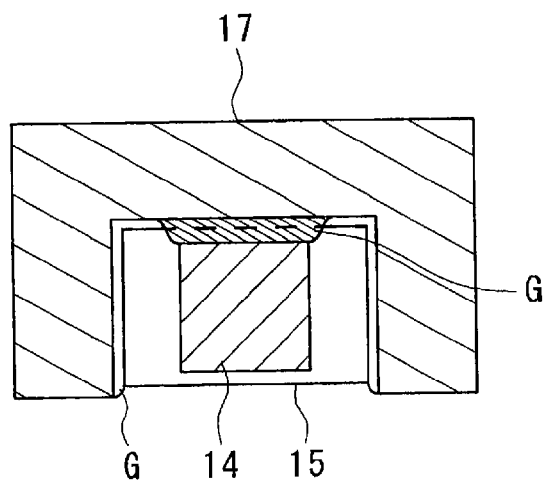
FIG. 16 is a cross sectional view of the piezoelectric actuator in FIG. 15.

FIG. 15 and FIG. 16 show a configuration of an X-axis actuator 8 of the third embodiment according to the present invention. In the X-axis actuator 8 of this embodiment is what changed from the second embodiment not to bond the lateral sides of the piezoelectric element 14. Thus, in this embodiment, the piezoelectric element 14 is bonded to the collar 17 at only one side of the rectangular circumference, and unbonded to the collar 17 at the other three sides.

Figure 17:
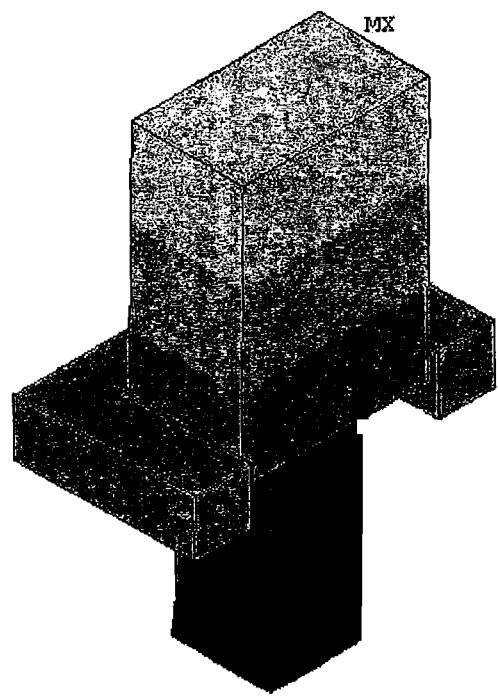
FIG. 17 is a displacement distribution map of the piezoelectric actuator in FIG. 15 with a positive static driving voltage applied.
Figure 18:
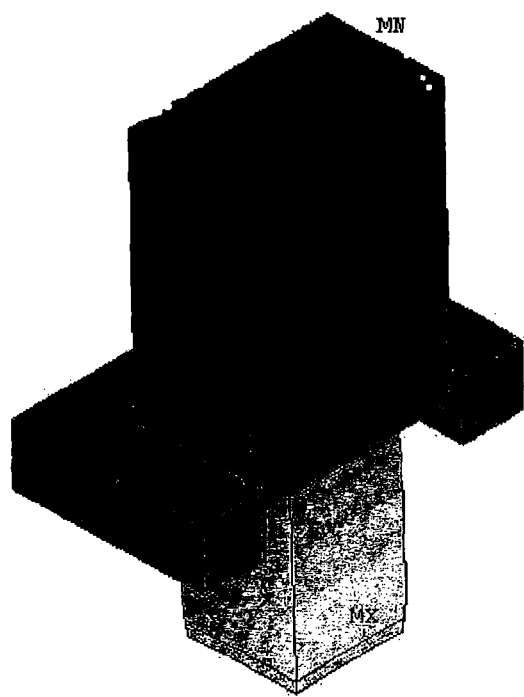
FIG. 18 is a displacement distribution map of the piezoelectric actuator in FIG. 15 with a negative static driving voltage applied.

FIG. 17 and FIG. 18 show displacements in the Y direction in the X-axis actuator 8 with the static driving voltage applied. FIG. 17 shows a case of applying +3V to the piezoelectric element 14, and FIG. 18 shows a case of applying −3V to the piezoelectric element 14. In this embodiment, the front end portion of the driving shaft 15 is displaced +9.7 nm in FIG. 17 and −9.7 nm in FIG. 18. It is meaning that the inclination of the driving shaft 15 and the consequent displacement of the X-axis aligning lens 3 are increased by not fastening lateral sides of the rectangular piezoelectric element 14 by the collar 17 compared to the second embodiment fastening lateral sides of the rectangular piezoelectric element 14 by the collar 17.

However, in the third embodiment, holding strength of the collar 17 to the piezoelectric element 14 is weaker than that of the second embodiment. Therefore it must be noted that this embodiment has a reduced the impact strength, because the piezoelectric element 14 is at risk for drooping out from the collar 17 with the adhesive G detached in response to such as an external impact.

Figure 19:
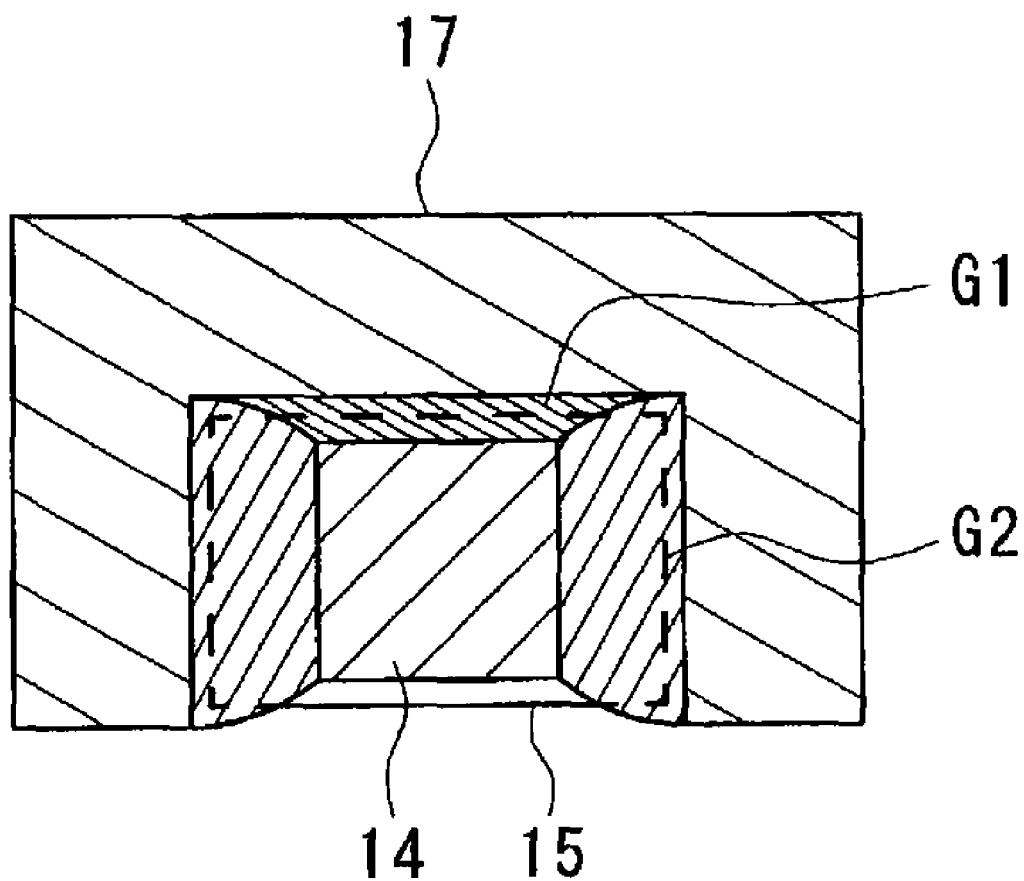
FIG. 19 is a cross sectional view of the piezoelectric actuator of the forth embodiment according to the present invention.

There, FIG. 19 shows a configuration of an X-axis actuator 8 of the third embodiment according to the present invention with complemented impact strength over the third embodiment. In this embodiment, the upper side of the rectangular piezoelectric element 14 is held via adhesive G1 having large Young's modulus, for instance, epoxy based, and the lateral sides of the rectangular piezoelectric element 14 are held via adhesive G2 having small Young's modulus, for instance, silicon based. The adhesive G2 having small Young's modulus has weaker fastening force to the piezoelectric element 14 and so allows the expansion and contraction layers 14a to expand and contract so as not to interfere in the inclination of the driving shaft 15 and the consequent displacement of the X-axis aligning lens 3. However, the adhesive G2 having small Young's modulus can hold the piezoelectric element 14 so that the piezoelectric element 14 does not droop out from the collar 17 when the external impact is applied to the X-axis actuator 8.

Figure 20:
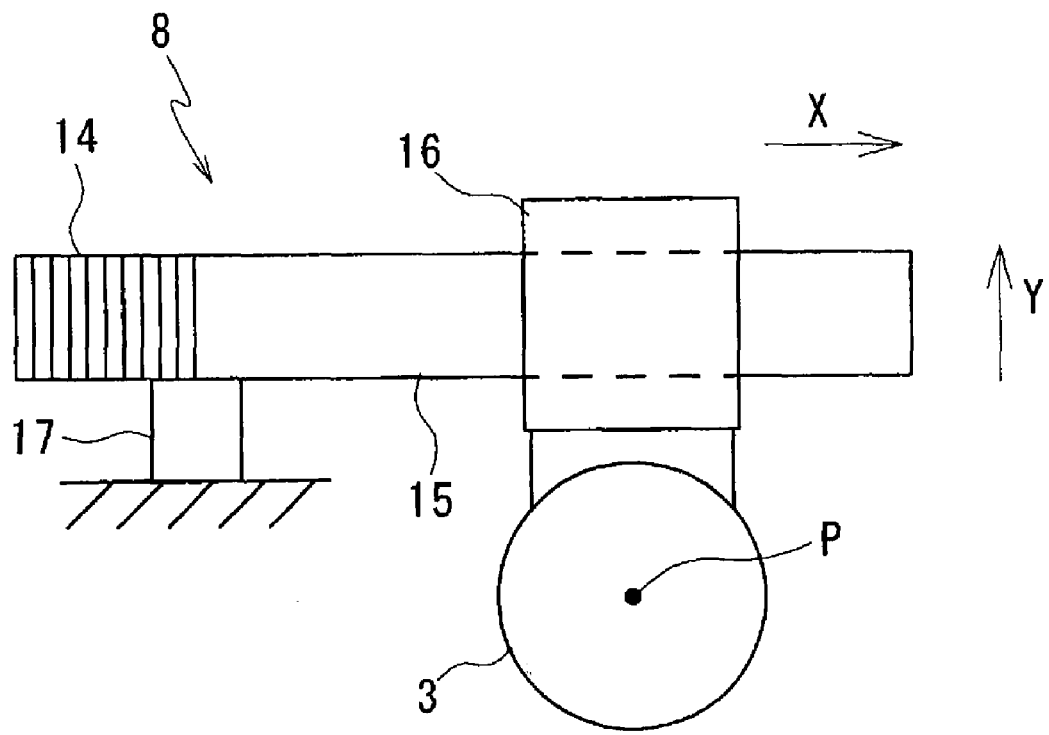
FIG. 20 is a schematic view of the piezoelectric actuator of the fifth embodiment according to the present invention.
Figure 21:
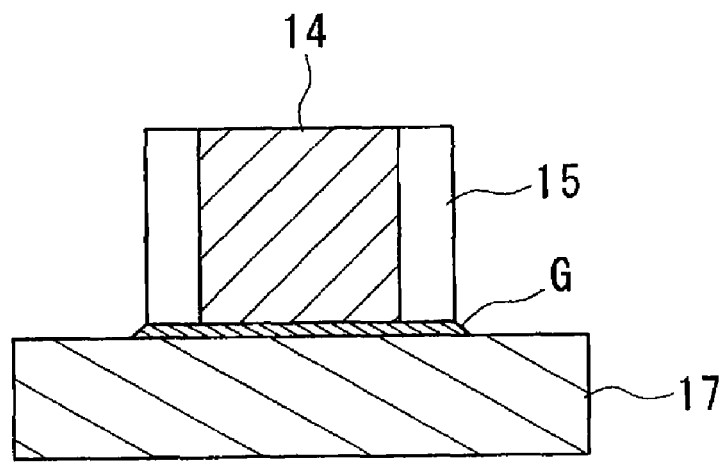
FIG. 21 is a cross sectional view of the piezoelectric actuator of the piezoelectric actuator in FIG. 20.
Figure 22:
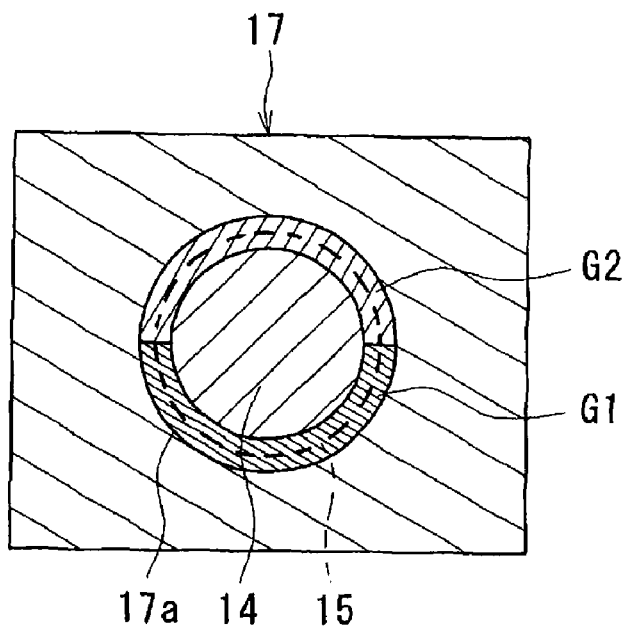
FIG. 22 is a cross sectional view of the piezoelectric actuator of the sixth embodiment according to the present invention.
Figure 23:
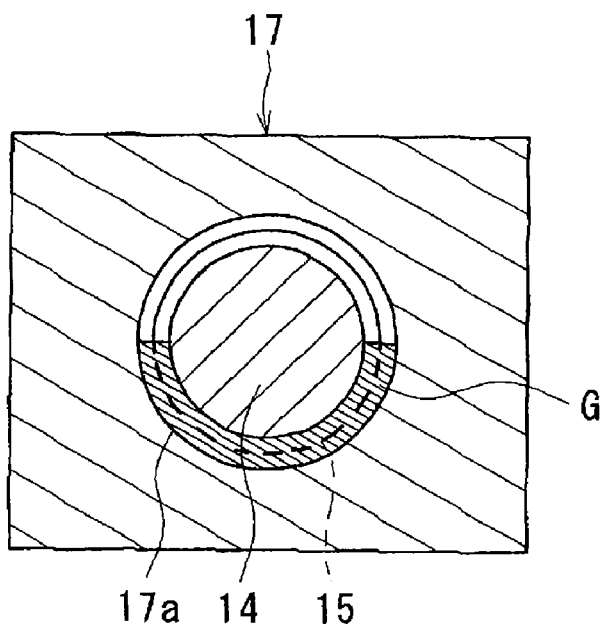
FIG. 23 is a cross sectional view of the piezoelectric actuator of the seventh embodiment according to the present invention.

Furthermore, FIG. 20 and FIG. 21 show a configuration of an X-axis actuator 8 of the fifth embodiment according to the present invention. The collar of this embodiment has a rectangular columnar form abutting to only one side of the bonded portion of the piezoelectric element 14 and the driving shaft 15. Therefore, bonded portion of the piezoelectric element 14 and the driving shaft 15 is bonded at only one side to the collar 17. Since the driving shaft 15 inclines its front end in the direction the collar 17 is bonded, if the optical center P of the X-axial aligning lens 3 is offset to the side where the piezoelectric element 14 and the driving shaft 15 is bonded to the collar 17, the optical center P of the X-axial aligning lens 3 moves in a direction getting away from the piezoelectric element 14 with the positive static driving voltage. If the optical center P of the X-axial aligning lens 3 is offset to the side where the piezoelectric element 14 and the driving shaft 15 is not bonded to the collar 17, the optical center P of the X-axial aligning lens 3 moves in a direction getting closer to the piezoelectric element 14 with the positive static driving voltage.

Furthermore, FIG. 20 and FIG. 21 show a configuration of an X-axis actuator 8 of the sixth embodiment according to the present invention. In this embodiment, the layered piezoelectric element 14 and the driving shaft 15 is shaped in circular columnar forms. And a circular fitting hole 17a sleeved around the piezoelectric element 14 and the driving shaft 15 is formed on the collar 17. The collar 17 and the piezoelectric element 14 are bonded each other in their half around with the adhesive G1 having high Young's modulus and in the other half around with the adhesive G2 having low Young's modulus.

In the configuration of this embodiment, collar 17 can restrict the deformation of the piezoelectric element 14 in an imbalanced manner with respect to the sectional center of the piezoelectric element 14 so as to cause a distorted deformation of the piezoelectric element 14 to incline the driving shaft 15.

Even in the case using such circular columnar piezoelectric element 14, as in the X-axis actuator 8 of the seventh embodiment according to the present invention, the collar 17 may be partially unbonded to the circumference of the piezoelectric element 14. Also, regardless of the circumferential shape of the piezoelectric element 14, three or more type of adhesive having different Young's modulus may be used. Furthermore, by changing the thickness of the adhesive layer partially, the fastening force of the collar 17 to the piezoelectric element 14 may be virtually imbalanced.

Figure 24:
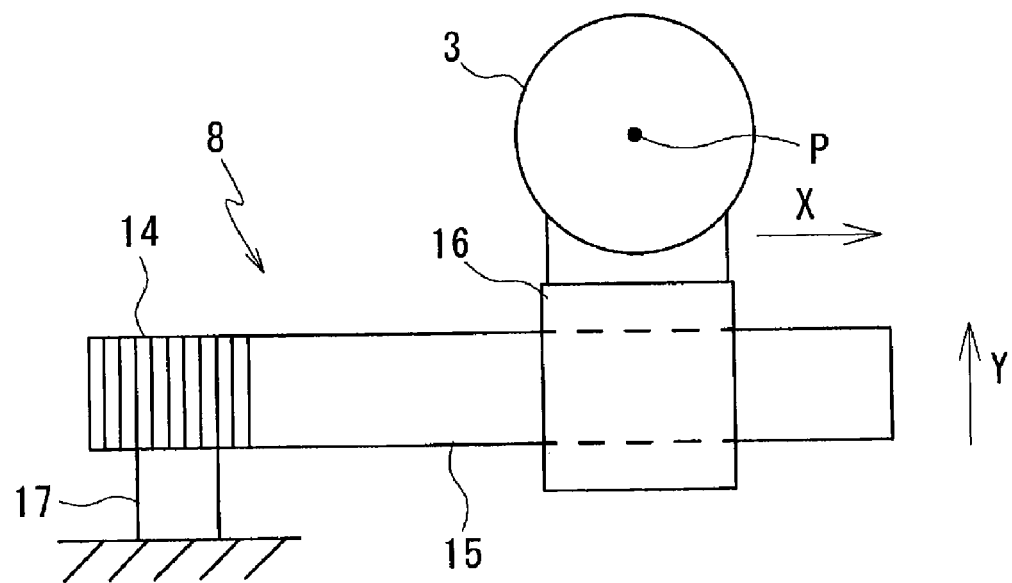
FIG. 24 is a schematic view of the piezoelectric actuator of the eighth embodiment according to the present invention.
Figure 25:
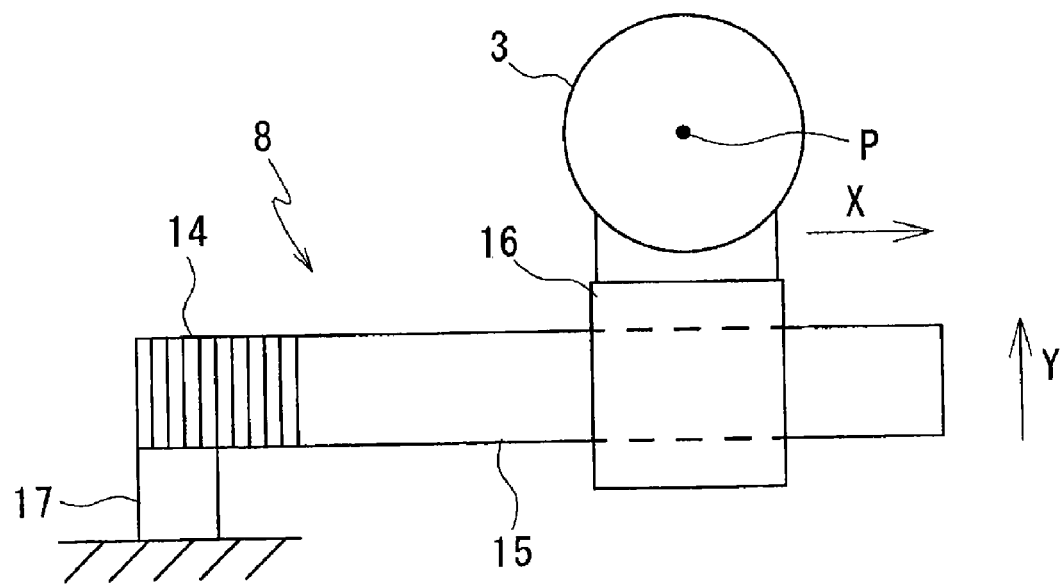
FIG. 25 is a schematic view of the piezoelectric actuator of the ninth embodiment according to the present invention.

Moreover, as in the eighth embodiment and ninth embodiment according to the present invention shown in FIG. 24 and FIG. 25, the collar 17 may hold any portion of the piezoelectric element 14 in the present invention. However, it is noted that if the position where the collar 17 holds the piezoelectric element 14 is away from the driving shaft 15, the reaction force of the driving shaft 15, movable member 16 and the alignment lens 3 working to the collar 17 and the adhesive G due to the expansion and contraction of the piezoelectric element 14 with the dynamic driving voltage applied is increased.

Figure 26:
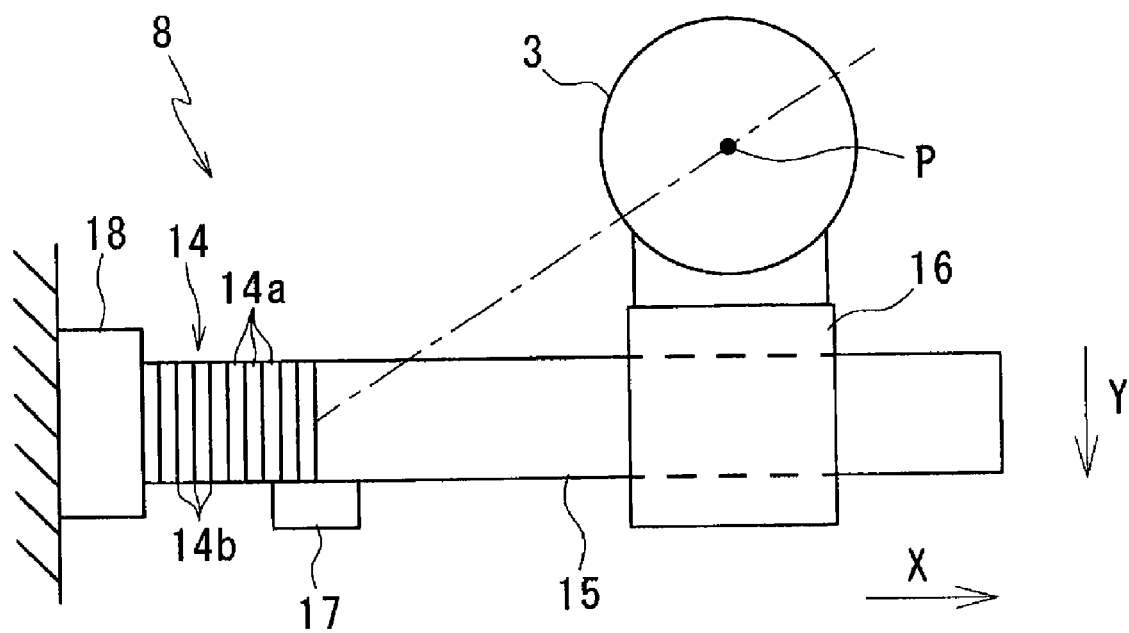
FIG. 26 is a schematic view of the piezoelectric actuator of the tenth embodiment according to the present invention.

Moreover, as in the tenth embodiment according to the present invention shown in FIG. 26, the piezoelectric actuator 8 may be fixed to a chassis or the like at an end of the piezoelectric element 14 opposite to the driving, preferably with interposition of a weight 18, not via the collar 17. In this case, an inclination angle of the driving shaft 15 is determined according to a relative angle between the both end faces of the piezoelectric element 14, and therefore the inclination angle of the driving shaft 15 is bigger than that in the case where the collar is fixed to the chassis and the like. Consequently, the displacing amount of the optical center P of the lens 3 in the Y direction can be increased.

What is claimed is:

1. A piezoelectric actuator comprising a layered piezoelectric element which consists of alternately stacked expansion and contraction layers and electrode layers, a driving shaft which is displaced by the piezoelectric element in expansion and contraction direction, a movable member frictionally engaging with the driving shaft and a collar bonded to the circumference of the piezoelectric element, wherein the collar is bonded to a plurality of the expansion and contraction layers so that the fastening force of the collar to the expansion and contraction layers is imbalanced with reference to the center of the cross section perpendicular to the direction of the expansion and contraction of the piezoelectric element.

2. The piezoelectric actuator according to claim 1, wherein the collar is not bonded partially to the circumference of the expansion and contraction layers.

3. The piezoelectric actuator according to claim 1, wherein the collar is bonded to the expansion and contraction layers with partially different adhesives having different Young's modulus.

4. The piezoelectric actuator according to claim 1, wherein the piezoelectric element has a circumference shaped in a rectangular form and one side of the circumference is bonded to the collar.

5. The piezoelectric actuator according to claim 1, wherein the piezoelectric element has a circumference shaped in a rectangular form and three side of the circumference are bonded to the collar.

6. The piezoelectric actuator according to claim 1, wherein the piezoelectric element has a circumference shaped in a circular form and the collar is bonded half around the piezoelectric element.

7. The piezoelectric actuator according to claim 1, wherein the collar is at least partially open viewed from the center of the cross section of the piezoelectric element.

8. The piezoelectric actuator according to claim 1, wherein the collar has a hole in which the piezoelectric element and the driving shaft are inserted.

9. The piezoelectric actuator according to claim 1, wherein the collar supports the bonded portion of the piezoelectric element and the driving shaft.

10. The piezoelectric actuator according to claim 1, wherein the working point of the movable member is offset from the driving shaft in a direction in which the fastening force of the collar is most imbalance.

11. A driving device comprising the piezoelectric actuator according to claim 1, and a driving circuit capable of applying a dynamic driving voltage and a static driving voltage to the piezoelectric element of the piezoelectric actuator, wherein the dynamic driving voltage causes the driving shaft of the piezoelectric actuator to reciprocate asymmetrically so as to displace slidingly the movable member, and the static driving voltage causes the driving shaft to move slowly so as not to displace slidingly the movable member.

12. The driving device according to claim 11, wherein the static driving voltage is a cyclic voltage having lower frequency than the dynamic driving voltage.

13. A positioning device comprising the driving device according to claim 11, a displacement detector outputting a displacement output which peaks when the movable member of the driving device is locating at a predetermined position, and comes lower with the movable member being further from the predetermined position, and a controller which determines the applying amount of the dynamic driving voltage based on a variation of the displacement output while a movement of the movable member with the static driving voltage, so as to maximize the displacement output.

14. A laser module comprising the positioning device according to claim 13 and a light receiving member receiving laser light and outputting the laser light, wherein the displacement detector of the positioning device is a sensor which detects the output power of the light receiving member and the movable member of the positioning device is an optical member which position the laser light with respect to the light receiving member.

* * * * *